United States Patent [19]

Yli-Paavola

[11] Patent Number: 5,210,508

[45] Date of Patent: May 11, 1993

[54] HIGH-FREQUENCY AMPLIFIER OF A RADIO TRANSMITTER

[75] Inventor: Kauko Yli-Paavola, Saarijärvi, Finland

[73] Assignee: Telenokia Oy, Espoo, Finland

[21] Appl. No.: 773,872

[22] PCT Filed: Apr. 10, 1990

[86] PCT No.: PCT/FI90/00099
§ 371 Date: Oct. 24, 1991
§ 102(e) Date: Oct. 24, 1991

[87] PCT Pub. No.: WO90/13173
PCT Pub. Date: Nov. 1, 1990

[30] Foreign Application Priority Data

Apr. 24, 1989 [FI] Finland .................................. 891939

[51] Int. Cl.⁵ .......................... H03G 3/30; H03F 3/16
[52] U.S. Cl. ..................................... 330/285; 330/277
[58] Field of Search ................ 330/85, 277, 278, 279, 330/285, 300, 131; 455/126

[56] References Cited

U.S. PATENT DOCUMENTS

| | | | |
|---|---|---|---|
| 3,644,832 | 2/1972 | Sherman, Jr. | 325/186 |
| 4,338,572 | 7/1982 | Schürmann | 330/285 X |
| 4,392,245 | 7/1983 | Mitama | 455/117 |
| 4,511,854 | 4/1985 | Kishida | 330/300 X |

*Primary Examiner*—Steven Mottola
*Attorney, Agent, or Firm*—Cushman, Darby & Cushman

[57] ABSTRACT

The invention relates to a high-frequency amplifier of a radio transmitter, comprising an amplifier stage the gain of which can be automatically controlled by a gain control feedback (L15, L16, D10, D11, A1, A2) coupled from a subsequent amplifier stage or the out-put of the high-frequency amplifier. The power consumption of the gain control is reduced, and the frequency stability of the amplifier stages and the preceding voltage-controlled oscillator is improved by the high-frequency amplifier according to the invention, wherein the amplifier stage comprises a two-gate field-effect transistor (Q1), the first gate (G1) of which constitutes the signal input, and the second gate (G2) of which constitutes the gain control input, to which said feedback (L15, L16, D10, D11, A1, A2) is coupled, and wherein the operating point of the transistor (Q1) is set by biasing the first gate (G1).

6 Claims, 1 Drawing Sheet

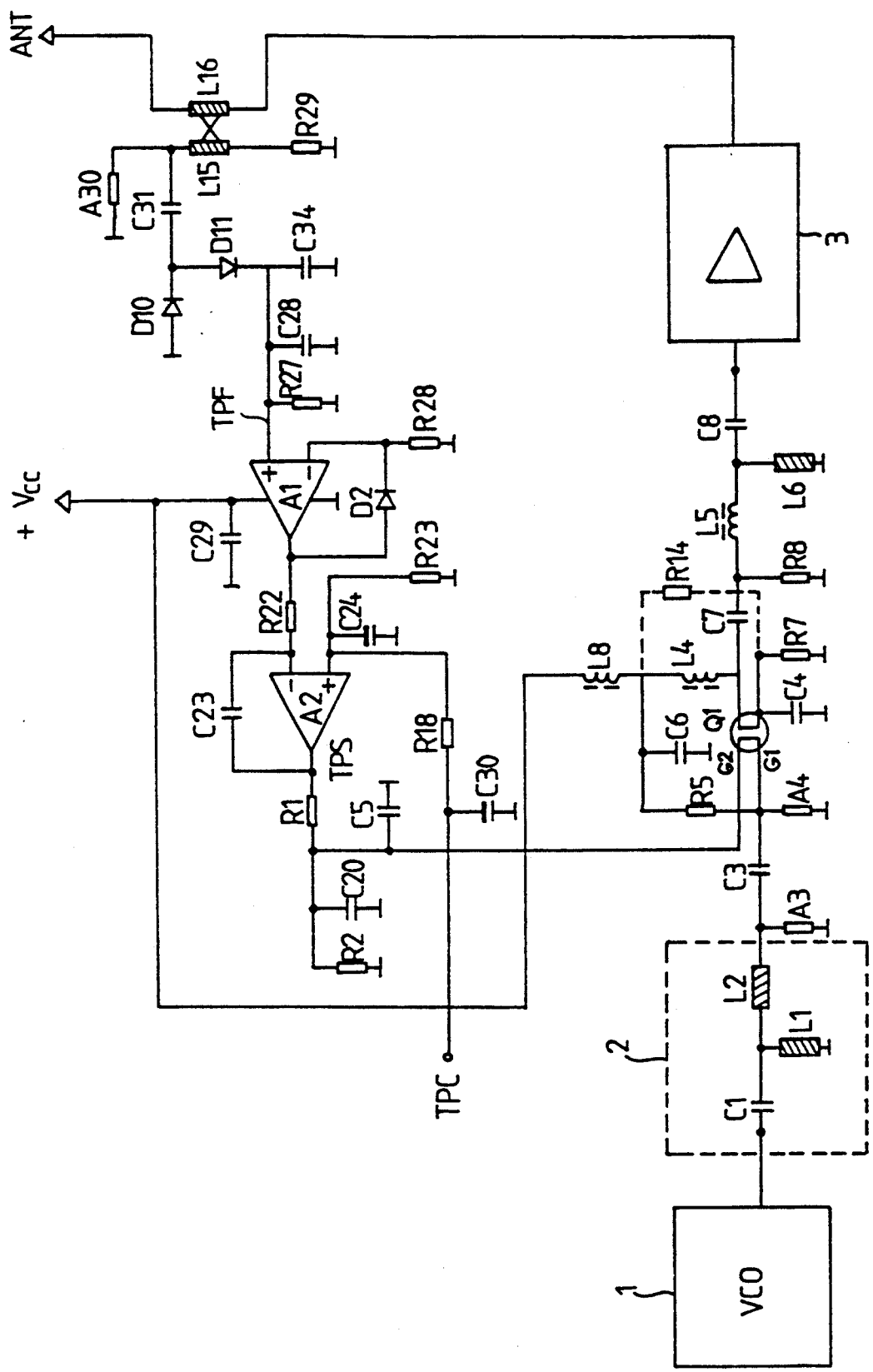

1

HIGH-FREQUENCY AMPLIFIER OF A RADIO TRANSMITTER

BACKGROUND OF THE INVENTION

1. Field of the Invention

The invention relates to a high-frequency amplifier of a radio transmitter, comprising an amplifier stage the gain of which can be automatically controlled by a gain control feedback coupled from a subsequent amplifier stage or the output of the high-frequency amplifier.

2. Description of the Prior Art

An automatic power control is used in many radio transmitters to maintain the transmission power constant irrespective of the different factors affecting it. Moreover, it must be possible especially in mobile telephone systems to select the transmission power of a mobile phone depending on the current radio link, for instance according to the information transmitted from the base station of a mobile phone.

Previously, a series transistor which regulates the current passing through an amplifier transistor in a manner depending on the actual transmission power has been used in one of the amplifier stages of a transmitter for controlling the transmission power. The problem with a transmission power control of such kind is that a series transistor consumes an excessive amount of current, which reduces the efficiency of the transmitter and shortens the charging interval of battery-driven transmitters.

Another problem with known high-frequency amplifiers is that the power control may affect the frequency stability of the transmitter by changing the load impedance of a modulator or a voltage-controlled oscillator (VCO) coupled before the amplifier stages, and thereby the frequency. To remove this problem there have been previously been attempts to increase the separation between the amplifier stages and the VCO by means of attenuators coupled between them.

SUMMARY OF THE INVENTION

The object of the invention is to provide an automatic transmission power control for a transmitter, which control has low power consumption and by means of which control the effect of a change in the load of a transmitter on the frequency thereof can be prevented.

This is achieved by a high-frequency amplifier of a radio transmitter of the type disclosed in the introductory portion, the amplifier being characterized in that the amplifier stage comprises a two-gate field-effect transistor, the first gate of which constitutes the signal input, and the second gate of which constitutes the gain control input to which said feedback is coupled, and that the operating point of the transistor is set by biasing the first gate.

As the gate control of a field-effect transistor is an almost pure voltage control, and the gate current is infinitesimal, the gain control of a field-effect transistor consumes practically no power at all. However, there is considerable separation between the gates of a field-effect transistor and correspondingly between the output electrodes and the gates of a field-effect transistor. Therefore the variations in the control signal supplied to the second gate on the one hand and the variations in the output load of the transistor on the other hand do not affect the first gate, to which the input signal is supplied, and do not change the operating point of the transistor, which is set from this gate. Thus, the power control of the amplifier stage does not affect the frequency of the voltage-controlled oscillator preceding the amplifier stage, and the attenuators between them can be omitted.

The power consumption of the amplifier stage can be minimized by setting the operating point of the field-effect transistor in such a manner that the transistor is in a substantially non-conducting state when no high-frequency signal is supplied to the first gate.

BRIEF DESCRIPTION OF THE DRAWINGS

In the following, the invention will be described, by way of example, in greater detail by means of a specific embodiment and with reference to the attached FIG. 1, which shows a circuit diagram of a high-frequency amplifier according to the invention.

DETAILED DESCRIPTION OF THE PREFERRED EMBODIMENTS

In FIG. 1, the amplifier stage according to the invention is the pre-stage in a high-frequency amplifier of a radio transmitter. The other amplifier stages of the high-frequency amplifier are generally illustrated by section 3. A voltage-controlled oscillator VCO, section 1, supplies a high-frequency modulated signal via a filter 2 to the high-frequency amplifier according to the invention. A power amplifier 3 in turn supplies the amplified signal to a transmitting antenna ANT either directly or e.g. through filter stages.

The pre-stage of the high-frequency amplifier consists of a two-gate field-effect transistor Q1, for instance of the type BF 998. The gate G1 of the transistor is fixedly biased by a voltage divider consisting of resistors R4 and R5 and connected between the operating voltage +Vcc and the ground. The resistors R4 and R5 set the operating point of the transistor Q1 preferably in such a manner that the transistor Q1 is in a substantially non-conducting state when no signal to be amplified is supplied to the gate G1. The supply of a signal to the gate G1 causes the pre-stage to function in the amplifier class A, B or C, depending on the bias of the transistor Q1.

The input impedance of the pre-stage is determined by a resistor R3, which is connected between the signal input of the pre-stage and the ground prior to a coupling capacitor C3. The resistor R3 has preferably a relatively small value, e.g. 1 k $\Omega$.

The output impedance of the pre-stage is correspondingly determined by a resistor R8, which is connected between the output of the pre-stage and the ground after a coupling capacitor C7. The resistor R8 has preferably a relatively small value, e.g. 5 $\Omega$, whereby the variations in the very high output impedance of the field-effect transistor connected in parallel with it do not affect the output impedance of the pre-stage. The input and output arrangements of the amplifier stage can thus be made wideband by means of the resistors R3 and R8.

The gain of the field-effect transistor Q1 is regulated by a control voltage TPS of the direct-current type supplied to the second gate G2 through the voltage divider R1 and R2. The gate G2 is further connected to the ground via a capacitor C5. The growth of the control voltage increases and the reduction thereof correspondingly decreases the gain of the pre-stage. When the source electrode of the transistor Q1 is connected to the ground by the parallel coupling of a resistor R7 and a capacitor C4 in accordance with FIG. 1, a gain control range of about 20 dB is achieved. If the source electrode is biased in the manner indicated by a dashed line in FIG. 1 by a resistor R14 coupled between the operating voltage Vcc and the source electrode, the control range is extended to 40 dB, but the power consumption increases considerably, too.

The control signal TPS is formed by a gain control feedback coupled from a subsequent amplifier stage or the output of the entire high-frequency amplifier to the gate G2. In the embodiment of FIG. 1, the output signal of the high-frequency amplifier 3 passes through a winding L16 (micro strip pattern) of a transformer T1, whereby a signal, which is proportionate to the intensity of the output signal of the amplifier 3, and which is half-wave rectified by diodes D10 and D11, is induced to a second winding L15 (micro strip pattern) of the transformer. The positive half cycles of the signal are amplified by an amplifier A1 and supplied to the inverting input of an integrating amplifier A2. A direct-current voltage TPC is applied as a set signal of the transmission power to the non-inverting input of the amplifier A2 from the other elements of the transmitter. If the average level of the half-wave rectified signal TPF in the inverting input of the amplifier A2 is higher or lower than the voltage TPC, the amplifier A2 correspondingly reduces or increases the control voltage TPS by the amount of said difference. The varying of the control voltage TPS in turn changes the gain of the transistor TRI in such a manner that the difference between the signals TPC and TPF is reduced. The control according to the invention is thus continuous with the aim to maintain the transmission power as high as the set value of the transmission power.

The set signal TPC can be formed, for instance, by the control logic of a receiver-transmitter e.g. on the basis of the selected channel or according to the information received from a control computer in mobile phone networks.

The feedback arrangement described above is not intended to restrict the invention. In practice, the control signal TPS can be formed in many alternative ways, also digitally.

The Figure and the description pertaining thereto are even otherwise intended merely to illustrate the invention Instead of the pre-stage of the amplifier, the gain control according to the invention can be positioned in another amplifier stage. Correspondingly, the pre-stage of the amplifier can be physically positioned apart from the other amplifier stages close to the VCO without departing from the spirit of the invention. In its details, the invention can be modified within the scope of the attached claims.

I claim:

1. A radio transmitter including antenna means for transmitting a radio signal and amplifier means coupled to receive an input signal from a voltage oscillator means for generating an output to said antenna means, said amplifier means comprising:

an amplifier stage having a two-gate field-effect transistor, a first gate of said two-gate transistor being coupled to said input signal, wherein the operating point of the two-gate transistor is set by appropriately biasing said first gate; and control feedback means coupled to a second gate of said two-gate transistor from any subsequent amplifier stage, said control feedback means comprising comparator means having a first input for receiving a feedback signal proportional to the actual transmission power, a second input for receiving a set value signal corresponding to a desired transmission power; and an output for applying a control signal which is a function of the difference between the signals received at said first and second inputs of said comparator means to the second gate of said two-gate transistor for controlling a gate of said transistor.

2. A radio transmitter is in claim 1, wherein said two-gate field-effect transistor is biased so as to be in a substantially non-conducting state when no signal is supplied to the first gate.

3. A radio transmitter as in claim 1, wherein the comparator means is an integrating operational amplifier, said first and second inputs of said comparator means corresponding to an inverting input and a non-inverting input, respectively, of said integrating operational amplifier.

4. A radio transmitter as in claim 3, wherein the feedback signal is a half-wave rectified signal derived from the output signal of said amplifier stage.

5. A radio transmitter as in claim 1, wherein a source electrode of the field effect transistor is connected through a series resistor to an operating voltage.

6. A radio transmitter as in claim 1, wherein the amplifier stage is a pre-stage amplifier.

* * * * *